United States Patent [19]

Ishii

[11] Patent Number: 4,518,928
[45] Date of Patent: May 21, 1985

[54] POWER SUPPLY CIRCUIT FOR AMPLIFIER

[75] Inventor: Satoshi Ishii, Tokyo, Japan

[73] Assignee: Pioneer Electronic Corporation, Tokyo, Japan

[21] Appl. No.: 449,935

[22] Filed: Dec. 15, 1982

[30] Foreign Application Priority Data

Dec. 15, 1981 [JP] Japan ................................ 56-202011

[51] Int. Cl.³ ............................................ H03F 3/30
[52] U.S. Cl. .................................... 330/297; 330/267
[58] Field of Search ........................ 330/267, 273, 297

[56] References Cited

U.S. PATENT DOCUMENTS 4,445,095 4/1984 Carver ................................ 330/297

FOREIGN PATENT DOCUMENTS 0068010 6/1981 Japan .................................... 330/297

OTHER PUBLICATIONS

Younge, "Bootstrapping Bias Supply Increases IC Voltage Capacity", *Electronics,* vol. 41, No. 22, Oct. 28, 1968, pp. 90, 91.

*Primary Examiner*—James B. Mullins
*Attorney, Agent, or Firm*—Sughrue, Mion, Zinn, Macpeak & Seas

[57] ABSTRACT

A power supply circuit for an amplifier is improved with respect to efficiency and lack of distortion by providing a circuit for supplying a voltage corresponding to the output signal level of the amplifier to a power supply terminal thereof. The circuit includes a phase compensated amplifier which receives an input signal corresponding to the amplifier output signal level.

7 Claims, 6 Drawing Figures

POWER SUPPLY CIRCUIT FOR AMPLIFIER

BACKGROUND OF THE INVENTION

This invention relates to a power supply circuit for an amplifier, and more particularly to a power supply circuit for a power amplifier.

To minimize power loss in a power amplifier and to improve power efficiency, the power supply method shown in FIG. 1 has been adopted. In FIG. 1, an input signal $v_i$ is amplified by a voltage amplification stage 1 and applied to a driver stage 3 through a bias stage 2, the driver stage being composed of transistors $Q_1$, $Q_2$ and a resistor $R_1$. The emitter outputs of the driver transistors $Q_1$, $Q_2$ become the base inputs of transistors $Q_3$, $Q_4$ which constitute an output power stage 4, respectively. The emitter outputs of both transistors $Q_3$, $Q_4$ drive a common load $R_L$ in a push-pull stage via resistors $R_2$, $R_3$.

Power supply circuits 5 and 6 are provided to supply power to the collector terminals of the output transistors $Q_3$, $Q_4$, respectively. In addition, a voltage source $\pm B_1$ is provided to generate a constant voltage at a low level. The voltage source $\pm B_1$ is used to apply a voltage to the collectors of the output transistors $Q_3$, $Q_4$ via unidirectional diodes $D_1$ and $D_2$. The power supply circuits shown at 5 and 6 are provided with emitter follower type transistors $Q_{11}$, $Q_{12}$ and $Q_{13}$, $Q_{14}$ arranged in a Darlington connection, respectively. The voltage obtained by shifting the level of an amplified output $v_o$ in positive and negative directions by Zener diodes $D_3$ and $D_4$ is supplied to the base of the transistors $Q_{11}$, $Q_{13}$. Power is supplied to the collector of each of the transistors $Q_{11}$, $Q_{12}$ and $Q_{13}$ and $Q_{14}$ from supply source $\pm(B_1B_2)$ in the circuit to allow them to operate as emitter followers, and a voltage corresponding to the circuit output $v_o$ is supplied to the collector of each of the output transistors $Q_3$, $Q_4$. Incidentally, current sources $I_1$, $I_2$ are used as operating current sources for the Zener diodes $D_3$, $D_4$.

In the power supply circuit thus arranged, when the level of the output signal $v_o$ is low, the diodes $D_1$, $D_2$ are simultaneously turned on so that the voltage of circuit supply sources $\pm B_1$ can be supplied as a source for the collectors of the output transistors $Q_3$, $Q_4$. When the absolute value of the base voltage of the transistors $Q_{11}$, $Q_{13}$ increases as the level of the output signal $v_o$ rises further, each of the transistors $Q_{11}$–$Q_{14}$ conducts and a voltage almost equal to the base voltage of the transistors $Q_{11}$, $Q_{13}$, that is, the voltage $|v_o+V_Z|$, is supplied at each emitter follower output as a power supply for the collector of each of the output transistors $Q_3$, $Q_4$. In this case, the Zener voltage $V_Z$ is that present in the Zener diodes $D_3$, $D_4$.

Accordingly, when the signal output is small, power is supplied from the lower voltage source and when the signal output becomes larger, a voltage changing according to the signal output is supplied as a power supply. Compared with an arrangement in which power is always supplied from a constant high voltage source, power loss is extremely reduced by this arrangement. FIG. 2 indicates the characteristic of the power loss against the output power; the method of FIG. 1 is shown by the solid line, whereas a method using a constant voltage source is indicated by the dotted line.

Although power efficiency is extremely improved by the circuit arrangement of FIG. 1, the emitter follower with the transistors $Q_{11}$–$Q_{14}$ in the power supply circuits 5 and 6 tends to oscillate readily under the influence of the inductance of lead wires and connection cords, the capacitance between electrodes, floating capacitances and the like. Compensation to prevent such oscillation has not been possible. In addition, when a signal having a high frequency component is applied, a time lag occurs in the voltage applied to the collectors of the transistors $Q_3$, $Q_4$, allowing the output transistors $Q_3$, $Q_4$ to be temporarily saturated and causing the occurrence of output signal distortion.

SUMMARY OF THE INVENTION

An object of the present invention is to provide a power supply circuit for an amplifier, in which oscillation is easily prevented without exerting influence on output signal distortion.

The power supply circuit according to the present invention includes a means for generating a voltage corresponding to the amplifying output signal level of the amplifier and for supplying this voltage to the power supply terminal of the amplifier. This supply circuit features the use of an amplifying means as the above supply means, to which phase compensation has been provided with the signal corresponding to the amplifying output signal level of the amplifier as an input; and the supply of the amplifier output by this amplifying means to the power supply terminal of the amplifier.

DETAILED DESCRIPTION OF THE PREFERRED EMBODIMENTS

Figure 1:
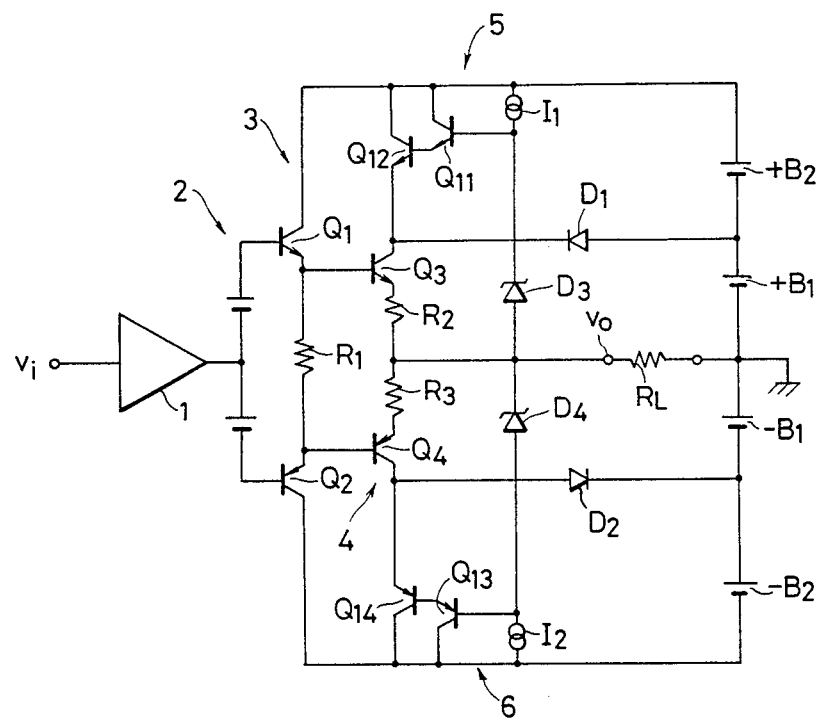
FIG. 1 is a diagram illustrating a prior art power supply circuit.
Figure 2:
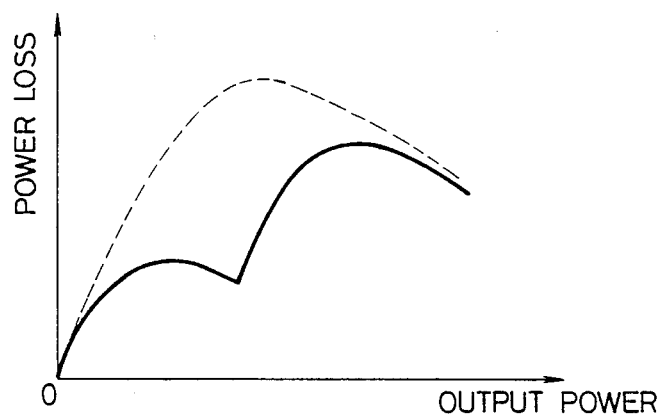
FIG. 2 is a characteristic diagram of the circuit of FIG. 1.
Figure 3:
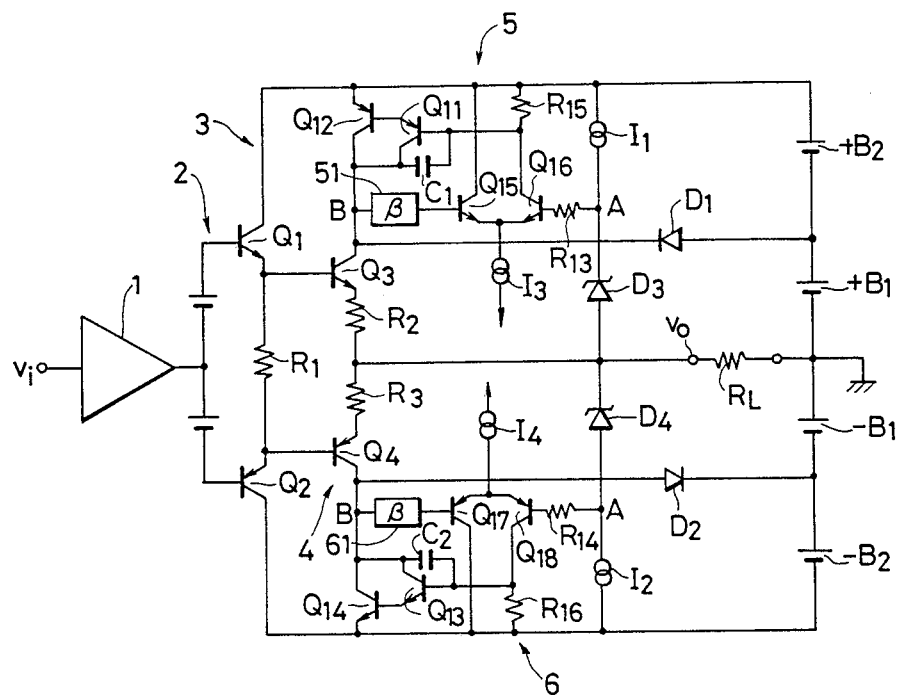
FIG. 3 is a circuit diagram of an example according to the present invention.

FIG. 3 is an example of a circuit according to the present invention, wherein the reference characters used in FIG. 1 designate like parts herein and throughout. The point of departure from the arrangement shown in FIG. 1 resides in an arrangement in which transistors $Q_{11}$, $Q_{12}$ and $Q_{13}$, $Q_{14}$ instead of as emitter followers are operated in a common-emitter hook-up for power supply circuits 5 and 6 as an amplifier having a predetermined voltage gain, respectively. One of the differential outputs of a differential amplifier comprising differential transistors $Q_{15}$, $Q_{16}$ and $Q_{17}$, $Q_{18}$ is applied by means of resistors $R_{15}$, $R_{16}$ to the base inputs of the transistors $Q_{11}$, $Q_{13}$. $I_3$ and $I_4$ are current sources for the respective differential amplifiers. A voltage given by $|v_o+V_Z|$ is applied as the base input of each of the differential transistors $Q_{16}$, $Q_{18}$, by means of resistors $R_{13}$, $R_{14}$. Accordingly, as the input of the amplifier comprising these differential amplifiers and the grounded-emitter circuits in the Darlington connection, the signal voltage $|v_o+V_Z|$ corresponding to the circuit output $v_o$ is introduced. To compensate for phase shifting caused by the transistor elements in the amplifiers 5 and 6, capacitors $C_1$ and $C_2$ for phase compensation are provided between the bases and collectors of the transistors $Q_{11}$, $Q_{13}$ and, because of this phase compensation, the risk of oscillation in the amplifiers 5 and 6 can be suppressed.

The collector output of each of the transistors $Q_{12}$, $Q_{14}$ becomes the collector supply source of each of the output transistors $Q_3$, $Q_4$ and is simultaneously fed back to each of the differential transistors $Q_{15}$, $Q_{17}$ via negative feedback circuits 51 and 61. Therefore, the potential at the collector terminals (B) of the output transistors $Q_3$, $Q_4$ is controlled so that it becomes equal to that at the base input terminals (A) of the differential transistors $Q_{16}$, $Q_{18}$, or $v_o + V_z$, so that the circuit operates in a manner similar to that shown in FIG. 1.

Figure 4:
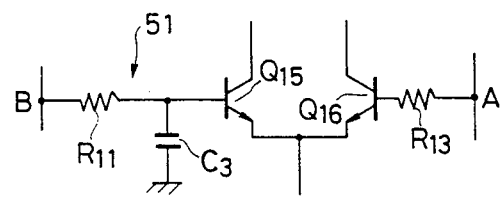
FIG. 4 is a diagram illustrating part of the circuit of FIG. 3.

As examples of the negative feedback circuits 51, 61, there may be provided such a circuit comprising only two resistors, each of which is provided between the collector terminals of the output transistors $Q_3$, $Q_4$ and the base input terminals of the differential transistors $Q_{15}$, $Q_{17}$, letting the gain of the power supply circuits 5, 6 be 1 with the feedback ratio $\beta$ being 1. Another arrangement comprises a negative feedback circuit having a resistor $R_{11}$ and a capacitor $C_3$, as shown in FIG. 4, setting the feedback ratio $\beta$ to $1/(1+SC_3R_{11})$. With the latter arrangement, although the gain in the lower region is 1, it is allowed to rise at an inclination of 6dB/OCT in the high region. Consequently, even if the input signal waveform changes sharply, the point B is allowed to have potential higher than that at point A at low amplitude; and the output transistor $Q_3$ ($Q_4$) will not reach the saturation point, eliminating distortion in the circuit output.

Figure 5:
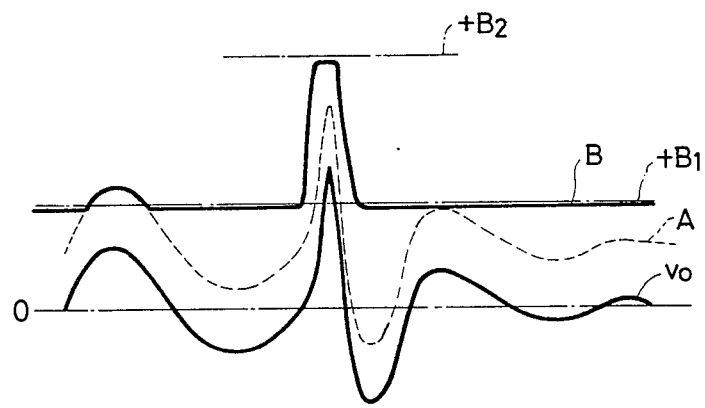
FIG. 5 is an operational waveform chart of the circuit of FIG. 3.

FIG. 5 is a waveform chart of the supply circuit 5 of FIG. 3. Since the power supply circuit 5 instantly follows up the sharp change in the signal waveform, distortion in the output signal will not occur.

Figure 6:
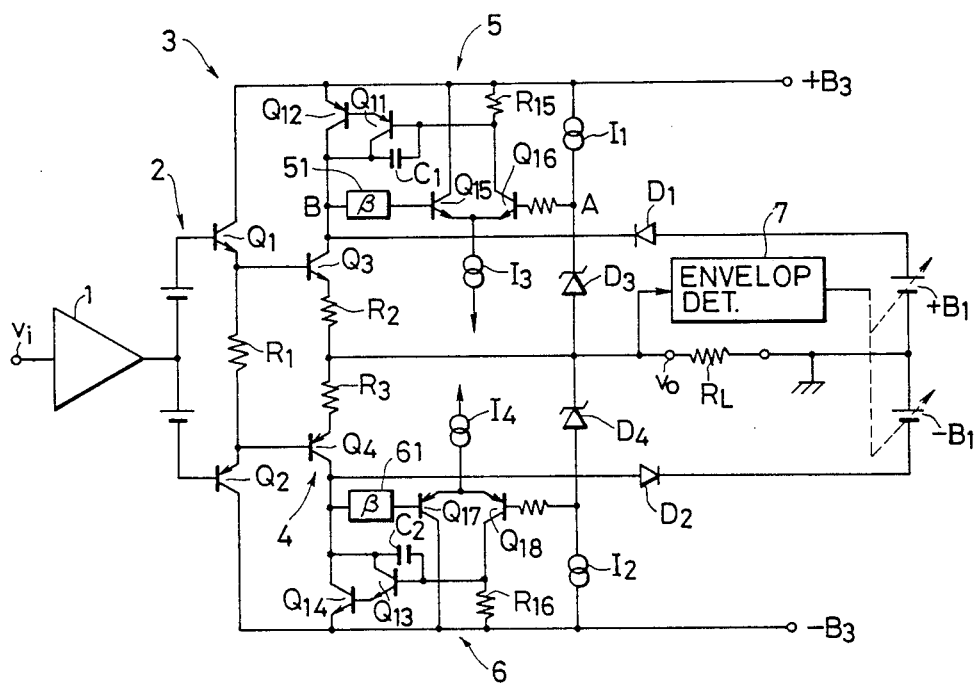
FIG. 6 is a circuit diagram of another example of the present invention.

FIG. 6 illustrates another example of a circuit according to the present invention, wherein like reference characters again designate like parts. In this example a supply source $\pm B_1$ of a low level is arranged so that it is allowed to change depending on the envelope of the signal $v_o$. For this purpose, an envelope detector 7 is provided and a voltage at a level corresponding to the output of the envelope detector is outputted from the power supply $\pm B_1$ and then applied to the collector of each of the output transistors $Q_3$, $Q_4$ via diodes $D_1$, $D_2$.

Accordingly, unless the output signal level changes sharply, the voltage source $\pm B_1$ corresponding to the envelope is supplied as the collector power supply of each of the output transistors $Q_3$, $Q_4$. If the output signal level changes sharply, the envelope detector 7 will not be able to follow up the change because of a greater time constant. Then, the power supply circuits 5 and 6 operate to supply a voltage changing rapidly according to the signal level $v_o$ from the collector of each of the transistors $Q_{12}$, $Q_{14}$ as the supply for the output transistors $Q_3$, $Q_4$.

As described, phase compensation is imparted to a power supply assembly in the form of an amplifier according to the present invention and the amplification characteristics of the power supply assembly are made to increase in the high frequency region in comparison with the low region by allowing the feedback characteristics of a negative feedback circuit to have frequency characteristics, so that a stable amplifying output free from oscillation with less output signal distortion can be obtained.

What is claimed is:

1. A power supply circuit for an amplifier, comprising; means for generating a voltage corresponding to the amplifying output signal level of said amplifier and for supplying said voltage to the power supply terminal of said amplifier, said supply means comprising a phase compensated amplifying means having a signal corresponding to said amplifying output signal level as an input, the output of said amplifying means being supplied to said power supply terminal, said amplifying means increasing the amplification degree rather than decreasing said degree in the high frequency region.

2. A power supply circuit as claimed in claim 1 wherein said supply means comprises a first amplifier having a predetermined voltage gain, and a differential amplifier receiving said signal corresponding to said amplifying output signal level.

3. A power supply circuit as claimed in claim 2, further including feedback means between an output of said first amplifier and said differential amplifier.

4. A power supply circuit as claimed in claim 3, said feedback means comprising resistor means.

5. A power supply circuit as claimed in claim 3, said feedback means comprising a combination of resistor means and capacitor means.

6. A power supply circuit as claimed in claim 1, including capacitor means for phase compensation of phase shifting in said amplifying means.

7. A power supply circuit as claimed in claim 1, further comprising envelope detection means receiving said amplifying output signal level, and variable power supply means constituting a circuit supply source and connected to said envelope detector, said variable power supply means outputting a voltage level corresponding to an output of said envelope detector, the output of said variable power supply means being supplied to said power supply terminal.

* * * * *